United States Patent
Li

(10) Patent No.: US 10,644,124 B2
(45) Date of Patent: May 5, 2020

(54) MOS-VARACTOR DESIGN TO IMPROVE TUNING EFFICIENCY

(71) Applicants: Semiconductor Manufacturing International (Beijing) Corporation, Beijing (CN); Semiconductor Manufacturing International (Shanghai) Corporation, Shanghai (CN)

(72) Inventor: Yong Li, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 16/214,201

(22) Filed: Dec. 10, 2018

(65) Prior Publication Data

US 2019/0109201 A1 Apr. 11, 2019

Related U.S. Application Data

(62) Division of application No. 15/489,768, filed on Apr. 18, 2017, now Pat. No. 10,186,593.

(30) Foreign Application Priority Data

Jul. 1, 2016 (CN) .......................... 2016 1 0512828

(51) Int. Cl.
*H01L 29/49* (2006.01)
*H01L 29/66* (2006.01)
*H01L 29/93* (2006.01)

(52) U.S. Cl.
CPC ...... *H01L 29/4966* (2013.01); *H01L 29/4983* (2013.01); *H01L 29/66174* (2013.01); *H01L 29/93* (2013.01); *H01L 29/4975* (2013.01)

(58) Field of Classification Search
CPC ............. H01L 29/4966; H01L 29/4983; H01L 29/66174; H01L 29/93; H01L 29/4975
(Continued)

(56) References Cited

U.S. PATENT DOCUMENTS 8,242,581 B1 * 8/2012 Ratnakumar ....... H01L 29/4983
257/312
2009/0057742 A1 3/2009 Lee et al.
(Continued)

FOREIGN PATENT DOCUMENTS

CN 102738246 10/2012

OTHER PUBLICATIONS

U.S. Appl. No. 15/489,768, Non-Final Office Action, dated Dec. 18, 2017, 22 pages.
(Continued)

*Primary Examiner* — Tong-Ho Kim
(74) *Attorney, Agent, or Firm* — Kilpatrick Townsend & Stockton LLP

(57) ABSTRACT

A gate stack structure for a MOS varactor includes a substrate including a channel region, a high-k dielectric layer on the channel region of the substrate, a P-type work function adjustment layer on the high-k dielectric layer, an N-type work function adjustment layer on the P-type work function adjustment layer, and a metal gate on the N-type work function adjustment layer. The P-type work function adjustment layer includes a first portion and a second portion laterally adjacent to each other, the first portion having a thickness greater than a thickness of the second portion. The (Continued)

gate stack structure in the MOS varactor can increase the tuning range of the MOS varactor.

7 Claims, 16 Drawing Sheets

(58) Field of Classification Search
USPC .......................................................... 257/312
See application file for complete search history.

(56) References Cited

U.S. PATENT DOCUMENTS

| | | |
|---|---|---|
| 2012/0256274 A1 | 10/2012 | Riess et al. |
| 2014/0237599 A1 | 8/2014 | Gertner et al. |
| 2015/0014780 A1 | 1/2015 | Kim et al. |
| 2016/0225871 A1 | 8/2016 | Cheng et al. |
| 2016/0365347 A1* | 12/2016 | Bao .................... H01L 27/0924 |
| 2018/0006127 A1 | 1/2018 | Li |

OTHER PUBLICATIONS

European Application No. 17178369.9, Extended European Search Report, dated Nov. 14, 2017, 10 pages.
Chinese Application No. 201610512828.4, Office Action dated Oct. 24, 2019, 19 pages (8 pages of Original Document and 11 pages of English Translation).

* cited by examiner

MOS-VARACTOR DESIGN TO IMPROVE TUNING EFFICIENCY

CROSS-REFERENCES TO RELATED APPLICATIONS

This application is a divisional of U.S. patent application Ser. No. 15/489,768, filed on Apr. 18, 2017, which claims priority to Chinese Patent Application No. 201610512828.4, filed with the State Intellectual Property Office of People's Republic of China on Jul. 1, 2016, the content of which is incorporated herein by reference in its entirety.

FIELD OF THE INVENTION

The present invention relates to semiconductor technology, and more particularly to a gate stack structure for a MOS varactor, a MOS varactor including the gate stack structure and manufacturing method thereof.

BACKGROUND OF THE INVENTION

Metal oxide semiconductor (MOS) varactors are widely used in radio frequency (RF) applications. In general, it is desirable for varactors to have a large tuning range to provide better functionality. However, conventional varactors typically employ gate stack structures for N-channel metal-oxide-semiconductor (NMOS) devices with relatively small tuning ranges.

Therefore, a novel gate stack structure and method of manufacturing the same are required to increase the tuning range of the MOS varactor.

BRIEF SUMMARY OF THE INVENTION

The inventor of the present disclosure extensively studied the prior-art problems of small tuning range of a MOS varactor and discovered that, if the gate stack structure is divided into two portions, one of which is used for the adjustment of the work function of the PMOS device and the other one for the adjustment of the work function of the NMOS device, the tuning range of the MOS varactor having such a gate stack structure is relatively large.

According to the present disclosure, a gate stack structure for a MOS varactor may include a substrate including a channel region, a high-k dielectric layer on the channel region of the substrate, a P-type work function adjustment layer on the high-k dielectric layer, an N-type work function adjustment layer on the P-type work function adjustment layer, and a metal gate on the N-type work function adjustment layer. The P-type work function adjustment layer includes a first portion and a second portion laterally adjacent to each other, the first portion having a thickness greater than a thickness of the second portion.

In one embodiment, the P-type work function adjustment layer includes a first TiN layer on a first portion of the high-k dielectric layer and a second TiN layer on the first TiN layer and on a second portion of the high-k dielectric layer. The first portion of the P-type work function adjustment layer includes the first TiN layer and a first portion of the second TiN layer on the first TiN layer. The second portion of the P-type work function adjustment layer includes a second portion of the second TiN layer on the second portion of the high-k dielectric layer.

In another embodiment, the P-type work function adjustment layer includes a first TiN layer on a first portion of the high-k dielectric layer, a TaN layer on the first TiN layer, and a second TiN layer on the TaN layer and on a second portion of the high-k dielectric layer. The first portion of the P-type work function adjustment layer includes the first TiN layer, the TaN layer, and a first portion of the second TiN layer on the TaN layer. The second portion of the P-type work function adjustment layer includes a second portion of the second TiN layer on the second portion of the high-k dielectric layer.

In yet another embodiment, the P-type work function adjustment layer includes a first TiN layer on a first portion of the high-k dielectric layer, a second TiN layer on the first TiN layer and on a second portion of the high-k dielectric layer, and a TaN layer on the second TiN layer. The first portion of the P-type work function adjustment layer includes the first TiN layer, the first portion of the second TiN layer on the first TiN layer, and a first portion of the TaN on the first portion of the second TiN layer. The second portion of the P-type work function adjustment layer includes a second portion of the second TiN layer on the second portion of the high-k dielectric layer and a second portion of the TaN on the second portion of the second TiN layer.

In some embodiments, the gate stack structure may further include a barrier layer disposed between the N-type work function adjustment layer and the metal gate.

In one embodiment, the N-type work function adjustment layer includes TiAl, TiCAl, TiNAl, or TiSiAl.

In one embodiment, a ratio of a length of the first portion to a length of the second portion of the P-type work function adjustment layer in a lateral direction is in a range between 1/9 and 9.

In one embodiment, the metal gate includes tungsten.

Embodiments of the present disclosure also provide a gate stack structure for a MOS varactor that may include a substrate including a channel region, a high-k dielectric layer on the channel region of the substrate, a P-type work function adjustment layer on the high-k dielectric layer, an N-type work function adjustment layer on the P-type work function adjustment layer, and a metal gate on the N-type work function adjustment layer. The P-type work function adjustment layer includes a first portion and a second portion laterally adjacent to each other. The first portion is configured to adjust the work function of a PMOS device, and the second portion is configured to adjust the work function of an NMOS device.

In one embodiment, the P-type work function adjustment layer includees a first TiN layer on a first portion of the high-k dielectric layer and a second TiN layer on the first TiN layer and on a second portion of the high-k dielectric layer. The first portion of the P-type work function adjustment layer includes the first TiN layer and a first portion of the second TiN layer on the first TiN layer; and the second portion of the P-type work function adjustment layer includes a second portion of the second TiN layer on the second portion of the high-k dielectric layer.

In another embodiment, the P-type work function adjustment layer comprises a first TiN layer on a first portion of the high-k dielectric layer, a second TiN layer on the first TiN layer and on a second portion of the high-k dielectric layer, and a TaN layer on the second TiN layer. The first portion of the P-type work function adjustment layer includes the first TiN layer, the first portion of the second TiN layer on the first TiN layer, and a first portion of the TaN on the first portion of the second TiN layer; and the second portion of the P-type work function adjustment layer includes a second portion of the second TiN layer on the second portion of the high-k dielectric layer and a second portion of the TaN on the second portion of the second TiN layer.

In yet another embodiment, a ratio of a length of the first portion to a length of the second portion of the P-type work function adjustment layer in a lateral direction is in a range between 1/9 and 9. In one embodiment, the N-type work function adjustment layer includes TiAl, TiCAl, TiNAl, or TiSiAl.

Embodiments of the present disclosure also provide a method for manufacturing a gate stack structure for a MOS varactor. The method may include providing a substrate including a channel region; forming a high-k dielectric layer on the channel region; forming a P-type work function layer on the high-k dielectric layer, the P-type work function adjustment layer including a first portion and a second portion laterally adjacent to each other, the first portion having a thickness greater than a thickness of the second portion; forming an N-type work function adjustment layer on the P-type work function adjustment layer; and forming a metal gate on the N-type work function adjustment layer.

In one embodiment, forming the P-type work function layer includes forming a first TiN layer on the high-k dielectric layer; removing a portion of the first TiN layer to expose a portion of the high-k dielectric layer; and forming a second TiN layer on a remaining portion of the first TiN layer and on the exposed portion of the high-k dielectric layer.

In one embodiment, forming the P-type work function layer includes forming a first TiN layer on the high-k dielectric layer; forming a TaN layer on the first TiN layer; removing a portion of the TaN layer and a portion of the first TiN layer to expose a portion of the high-k dielectric layer; and forming a second TiN layer on a remaining portion of the TaN layer and on the exposed portion of the high-k dielectric layer.

In one embodiment, forming the P-type work function layer includes forming a first TiN layer on the high-k dielectric layer; removing a portion of the first TiN layer to expose a portion of the high-k dielectric layer; forming a second TiN layer on a remaining portion of the first TiN layer and on the exposed portion of the high-k dielectric layer; and forming a TaN layer on the second TiN layer.

In one embodiment, the method may further include forming a barrier layer on the N-type work function adjustment layer.

The following description, together with the accompanying drawings, will provide a better understanding of the nature and advantages of the claimed invention.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF THE INVENTION

Figure 1:
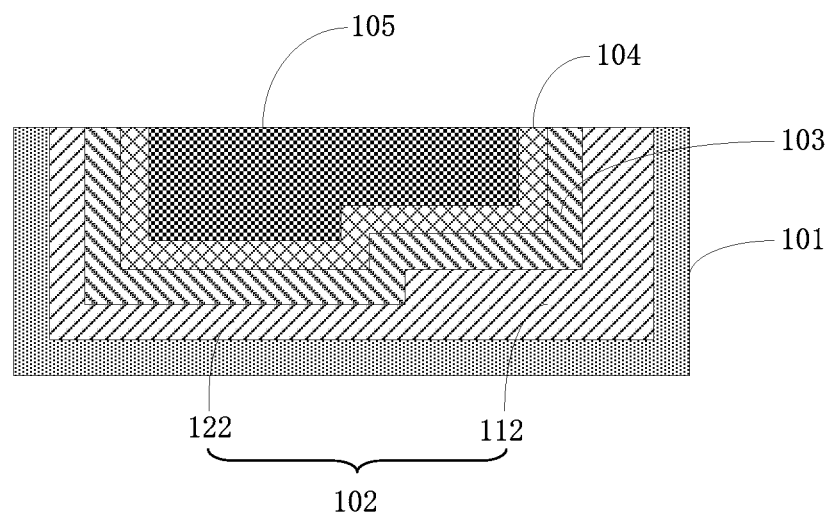
FIG. 1 is a cross-sectional view of a gate stack structure for a MOS varactor according to one embodiment of the present disclosure.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

The inventor of the present disclosure extensively studied the prior-art problems of small tuning range of a MOS varactor and discovered that, if the gate stack structure is divided into two portions, one of which is used for the adjustment of the work function of the PMOS device and the other one for the adjustment of the work function of the NMOS device, the tuning range of the MOS varactor having such a gate stack structure is relatively large.

Thus, the present disclosure provides a gate stack structure for a MOS varactor comprising a high-k dielectric layer disposed above a channel region in a substrate, a P-type work function adjustment layer on the high-k dielectric layer, an N-type work function adjustment layer on the P-type work function adjustment layer, and a metal gate on the N-type work function adjustment layer. The P-type work function adjustment layer includes a first portion and a second portion different from the first portion. The first portion and the second portion are laterally adjacent to each other, i.e., the first and second portions are abutting each other. The first portion is configured to adjust the work function of the PMOS device, and the second portion is configured to adjust the work function of the NMOS device.

It should be noted that, as used herein in the present disclosure, the P-type work function adjustment layer refers to an adjustment layer used for adjusting the work function of a P-channel metal oxide semiconductor (PMOS) device, and the N-type work function adjustment layer refers to an adjustment layer used for adjusting the work function of an N-channel metal oxide semiconductor (NMOS) device.

In one embodiment, the P-type work function adjustment layer may include a first TiN (titanium nitride) layer on a portion of the high-k dielectric layer, a TaN (tantalum nitride) layer on the first TiN layer, a second TiN layer on the TaN layer and on another portion of the high-k dielectric layer. The first portion of the P-type work function adjustment layer may include the first TiN layer on a portion of the high-k dielectric layer, the TaN layer on the first TiN layer, and a portion of the second TiN layer on the TaN layer. The second portion of the P-type work function adjustment layer may include another portion of the second TiN layer on the another portion of the high-k dielectric layer.

In another embodiment, the P-type work function adjustment layer may include a first TiN layer on a portion of the high-k dielectric layer, a second TiN layer on the first TiN layer and on another portion of the high-k dielectric layer, and a TaN layer on the second TiN layer. The first portion of the P-type work function adjustment layer may include the first TiN layer on a portion of the high-k dielectric layer, the second TiN layer on the first TiN layer, and the TaN layer on the second TiN layer. The second portion of the P-type work function adjustment layer may include the second TiN layer on the another portion of the high-k dielectric layer, and the TaN layer on the second TiN layer (i.e., the second TiN layer on the another portion of the high-k dielectric layer).

In a preferred embodiment, the ratio of the length of the first portion to the second portion of the P-type work function adjustment layer in the lateral direction relative to the channel region is in the range between 1/9 and 9, e.g., 3, 5, 7, etc.

Further, the inventor of the present disclosure also discovered that, as long as the thickness of the first portion is greater than the thickness of the second portion, the MOS varactor tuning range can be increased. Thus, the inventor also proposed the following schemes.

Figure 8A:
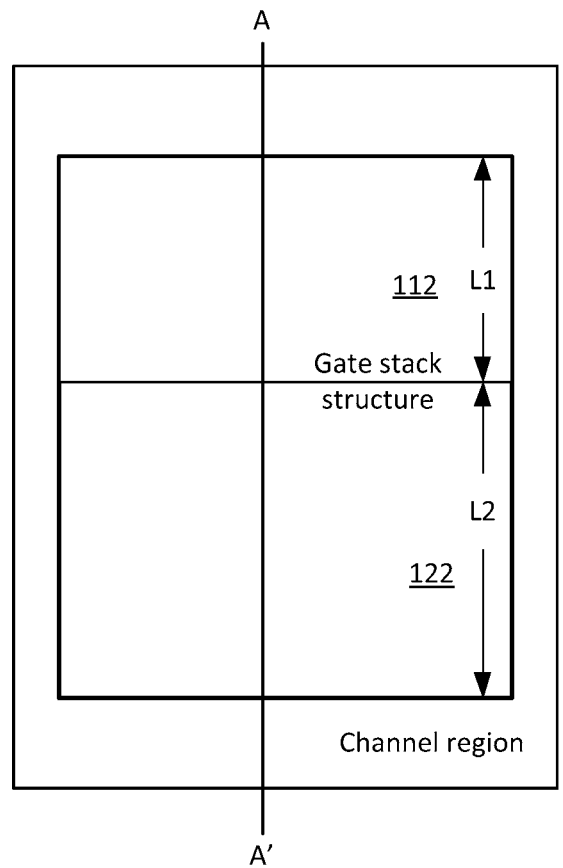
FIG. 8A is a plan view illustrating a gate stack structure for a MOS varactor according to one embodiment of the present disclosure.

It is to be noted that, the "cross-sectional views" hereinafter refer to cross-sectional views in the vertical direction of the channel, as shown in FIG. 8A.

Figure 8B:
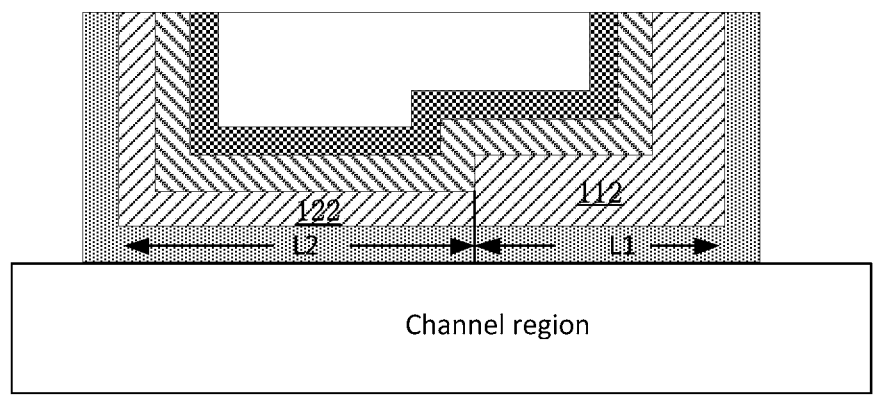
FIG. 8B is a cross-sectional view of the gate stack structure shown in FIG. 8A.

FIG. 8A is a plan view of a gate stack structure according to one embodiment of the present disclosure. Referring to FIG. 8A, a gate stack structure is disposed on a channel region that may be doped well for forming a lower electrode of a varactor. The gate stack structure includes a first portion 112 and a second portion 122. FIG. 8B is a cross-sectional view illustrating the gate stack structure taken along the line AA'. Detail of the gate structure will be described in detail in the sections below.

FIG. 1 is a cross-sectional view of a gate stack structure for a MOS varactor according to one embodiment of the present disclosure. Referring to FIG. 1, the gate stack structure includes a high-k dielectric layer 101 above the channel region in the substrate, and a P-type work function adjustment layer 102 on high-k dielectric layer 101. P-type work function adjustment layer 102 includes a first portion 112 and a second portion 122 adjacent to first portion 112 in the direction of the vertical channel. First portion 112 has a thickness that is greater than the thickness of second portion 122. In one embodiment, the ratio of the length of the first portion to the second portion of the P-type work function adjustment layer in the direction of the vertical channel is in the range between 1/9 and 9, e.g., 3, 5, 7, etc.

The gate stack structure further includes an N-type work function adjustment layer 103 on P-type work function adjustment layer 102, and a metal gate 105 on N-type work function adjustment layer 103. In one embodiment, the gate stack structure also includes a barrier layer (e.g., TiN or the like) 104 disposed between N-type work function adjustment layer 103 and metal gate 105. In one embodiment, N-type work function adjustment layer 103 may include TiAl, TiCAl, TiNAl, or TiSiAl. In one embodiment, metal gate 105 may include tungsten.

In the embodiment, P-type work function adjustment layer 102 in the gate stack structure includes two portions: a first portion of P-type work function adjustment layer 102 has a thickness that is greater than that of a second portion. This gate stack structure can increase the tuning range of the MOS varactor.

It is to be understood that P-type work function adjustment layer 102 in the above-described gate stack structure may be implemented in different ways as long as the thickness of first portion 112 is greater than the thickness of second portion 122.

Three specific implementations of a gate stack structure for a MOS varactors are described below with reference to FIGS. 2A to 2C.

Figure 2A:
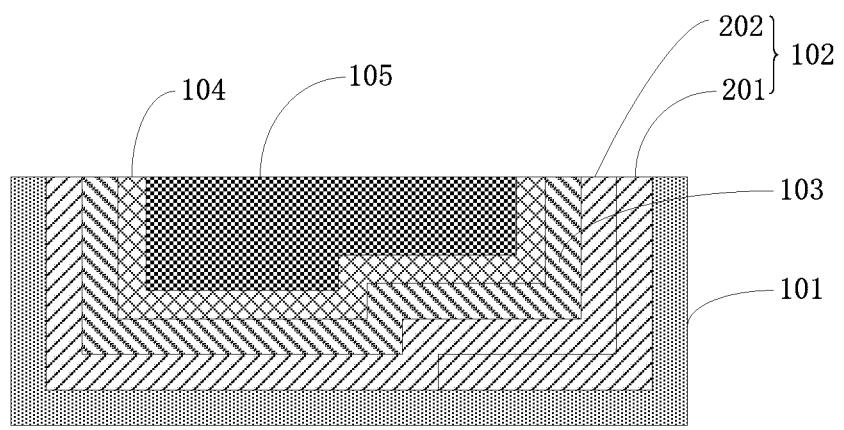
FIG. 2A is a cross-sectional view of a gate stack structure for a MOS varactor according to one embodiment of the present disclosure.

FIG. 2A is a cross-sectional view of an embodiment of a gate stack structure for a MOS varactor. Referring to FIG. 2A, P-type work function adjustment layer 102 includes a first TiN layer 201 on a first portion of high-k dielectric layer 101 and a second TiN layer 202 on first TiN layer 201 and a second portion of high-k dielectric layer 101. In this particular embodiment, first portion 112 of P-type work function adjustment layer 102 may include first TiN layer 201 and a first portion of second TiN layer 202 over first TiN layer 201. Second portion 122 of P-type work function adjustment layer 102 may include a second portion of second TiN layer 202 on the second portion of high-k dielectric layer 101.

Figure 2B:
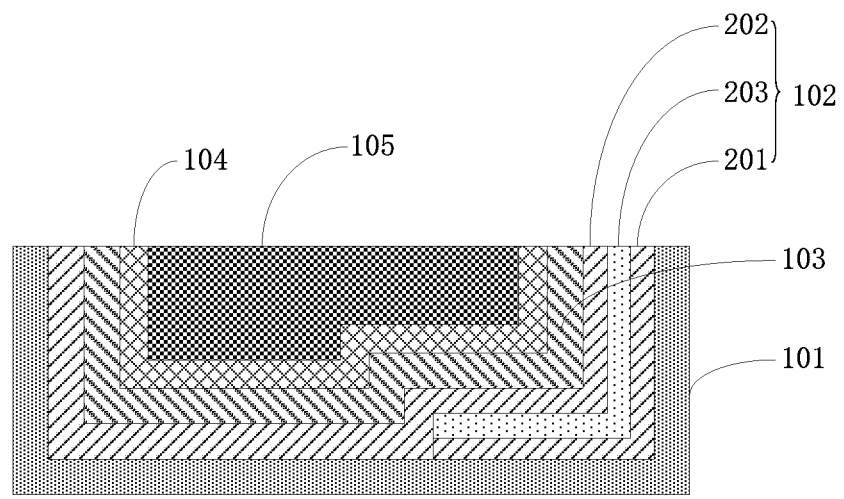
FIG. 2B is a cross-sectional view of a gate stack structure for a MOS varactor according to another embodiment of the present disclosure.

FIG. 2B is a cross-sectional view of another embodiment of a gate stack structure for a MOS varactor. Referring to FIG. 2B, P-type work function adjustment layer 102 includes a first TiN layer 201 on a first portion of high-k dielectric layer 101, a TaN layer 203 on first TiN layer 201, and a second TiN layer 202 on TaN layer 203 and on a second portion of high-k dielectric layer 101. In this particular embodiment, first portion 112 of P-type work function adjustment layer 102 may include first TiN layer 201, a TaN layer 203 on first TiN layer 201 and a first portion of second TiN layer 202 on TaN layer 203. Second portion 122 of P-type work function adjustment layer 102 may include a second portion of second TiN layer 202 on the second portion of high-k dielectric layer 101.

Comparing with the embodiment shown in FIG. 2A, the first portion of the embodiment in FIG. 2B further includes a TaN layer 203 disposed between first TiN layer 201 and second TiN layer 202. TaN layer 203 is configured to prevent metal elements (e.g., Al) in the N-type work function layer 103 from diffusion into high-k dielectric layer 101 that is disposed below second portion 122, thereby avoiding the adverse effect of TaN layer 203 on the work function of first portion 112 and degrading the performance of high-k dielectric layer 101.

Figure 2C:
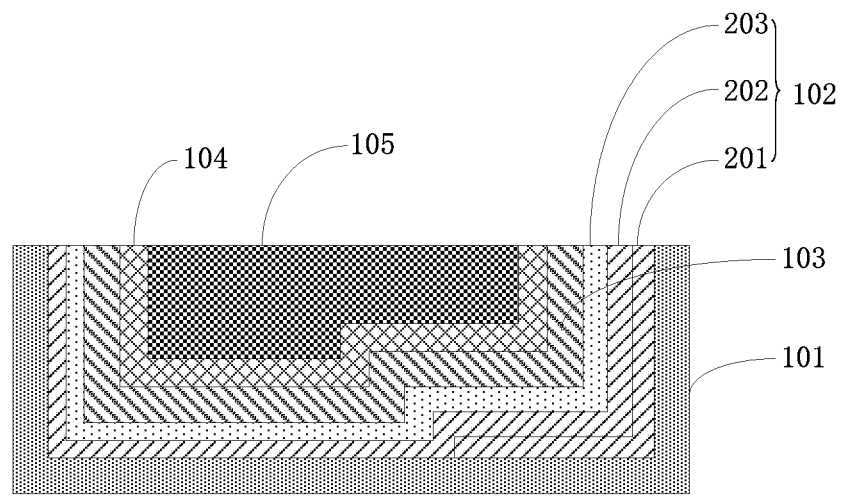
FIG. 2C is a cross-sectional view of a gate stack structure for a MOS varactor according to yet another embodiment of the present disclosure.

FIG. 2C is a cross-sectional view of yet another embodiment of a gate stack structure for a MOS varactor. Referring to FIG. 2C, P-type work function adjustment layer 102 includes a first TiN layer 201 on a first portion of high-k dielectric layer 101, a second TiN layer 202 on first TiN layer 201 and on a second portion of high-k dielectric layer 10, and a TaN layer 203 on second TiN layer 202. In this particular embodiment, first portion 112 of P-type work function adjustment layer 102 may include first TiN layer 201, second TiN layer 202 on first TiN layer 201, and a TaN layer 203 on a first portion of second TiN layer 202, and a first portion of TaN layer 203 on a first portion of second TiN layer 202 (i.e., the portion of second TiN layer 202 on first TiN layer 201). Second portion 122 of P-type work function adjustment layer 102 may include a second portion of second TiN layer 202 on the second portion of high-k dielectric layer 101 and a second portion of TaN layer 203 on the second portion of second TiN layer 202 (i.e., the portion of second TiN layer 202 on the second portion of high-k dielectric layer 101).

Comparing with the embodiment shown in FIG. 2A, the embodiment in FIG. 2C further includes a TaN layer 203 that can prevent metal elements (e.g., Al) in the N-type work function layer 103 from diffusion into high-k dielectric layer 101, thus avoiding the performance degradation of high-k dielectric layer 101.

It is noted that high-k dielectric layer 101 includes a first portion and a second portion that are adjacent to each other in the lateral direction.

The present disclosure also provides a MOS varactor that may include a gate stack structure for a MOS varactor as described in any one of the embodiments described above.

Figure 3:
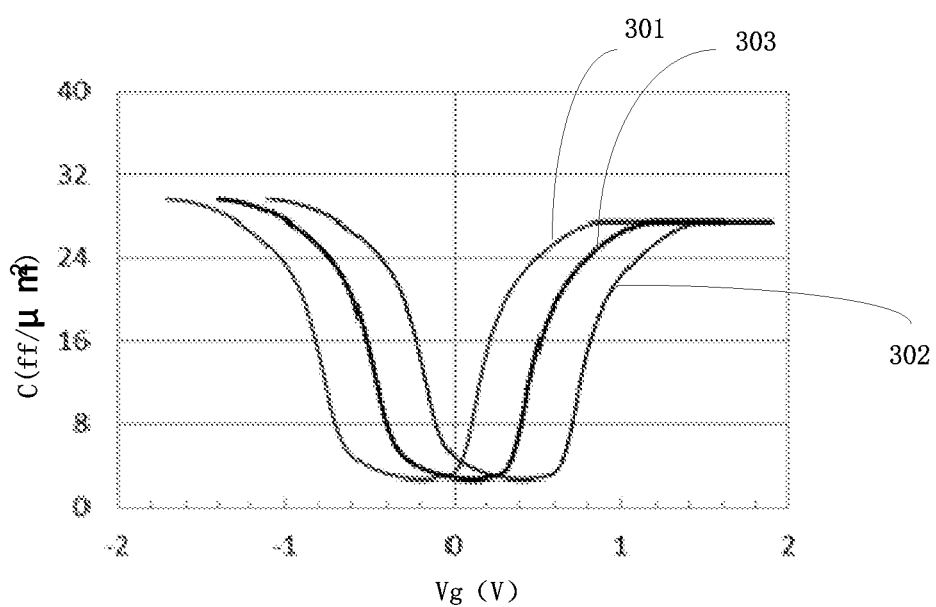
FIG. 3 is a simulated schematic diagram of a C-V (capacitance-gate voltage) graph for a MOS varactor according to one embodiment of the present disclosure.

FIG. 3 is a simulated schematic diagram of a C-V (capacitance-gate voltage) graph having three lines for a MOS varactor according to one embodiment of the present disclosure. Referring to FIG. 3, line 301 is associated with a C-V curve of a MOS varactor using an NMOS gate stack structure; line 302 is associated with a C-V curve of a MOS varactor using a PMOS gate stack structure; line 303 is associated with a C-V curve of a MOS varactor using a gate stack structure according to one embodiment of the present disclosure. The maximum capacitance of the three lines is substantially the same, and at Vg=0, line 303 corresponds to the smallest capacitance, therefore, line 303 corresponds to the MOS varactor that has the largest tuning range or the best tunability.

Figure 4:
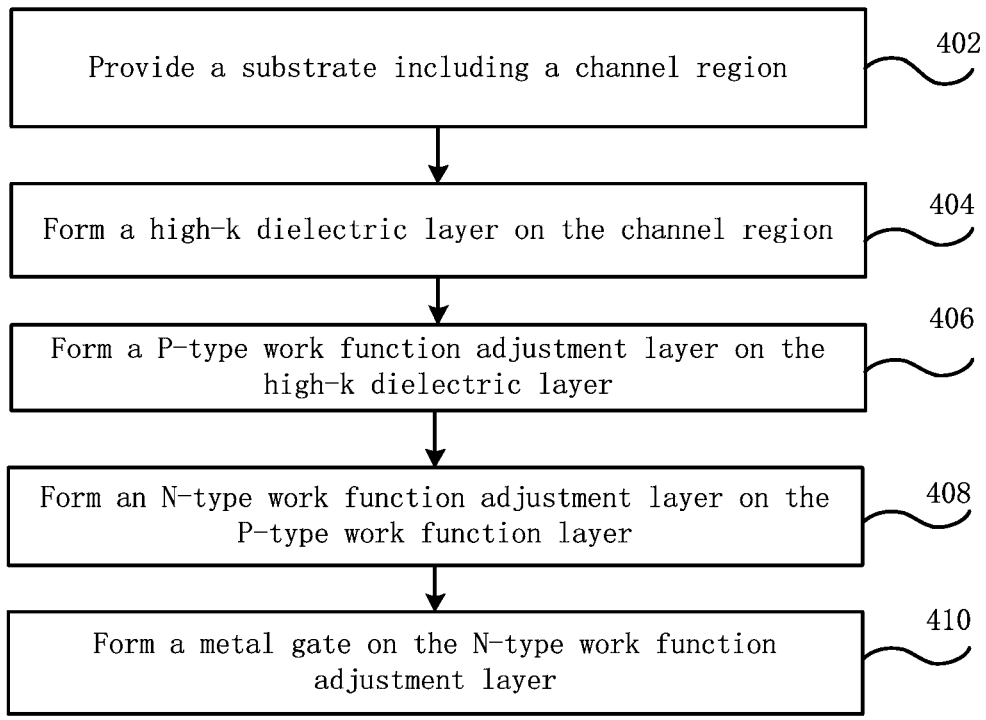
FIG. 4 is a simplified flowchart of a method for manufacturing a gate stack structure for a MOS varactor according to one embodiment of the present disclosure.

The present disclosure also provides a method of manufacturing a gate stack structure for a MOS varactor. FIG. 4 is a simplified flowchart of a method of manufacturing a gate stack structure for a MOS varactor. Referring to FIG. 4, the method may include the following steps:

Step 402: providing a substrate including a channel region.

Step 404: forming a high-k dielectric layer on the channel region.

Step 406: forming a P-type work function adjustment layer on the high-k dielectric layer, the P-type work function adjustment layer includes a first portion and a second portion adjacent to each other in the lateral direction, the first portion has a thickness that is greater than the thickness of the second portion. In one embodiment, the ratio of the length L1 of the first portion to the length L2 of the second portion in the lateral direction relative to the channel is in the range between 1/9 and 9.

Step 408: forming an N-type work function adjustment layer on the P-type work function adjustment layer.

Step 410: forming a metal gate on the N-type work function adjustment layer.

FIGS. 5A through 5G are cross-sectional views illustrating intermediate stages of a method for manufacturing a gate stack structure for a MOS varactor according to one embodiment of the present disclosure.

Figure 5A:
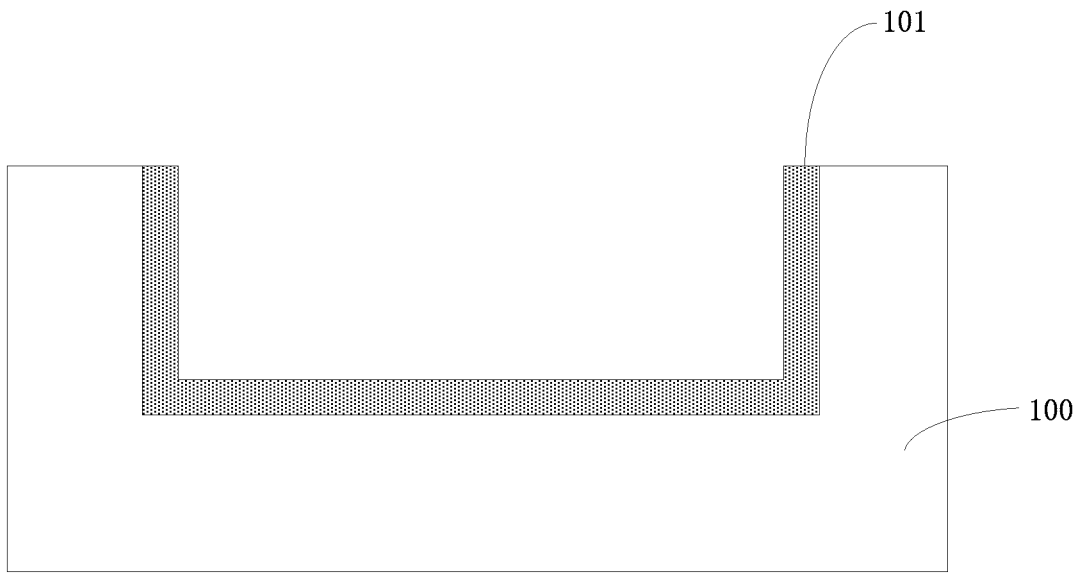
FIG. 5A is a cross-sectional view illustrating an intermediate stage of a method for manufacturing a gate stack structure for a MOS varactor according to one embodiment of the present disclosure.

Referring to FIG. 5A, a substrate 100 is provided. Substrate 100 includes a channel region (not shown). Substrate 100 may further include a shallow trench isolation structure or the like. Thereafter, a high-k dielectric layer 101 is formed (e.g., using a deposition process) on the channel region in substrate 100. It is to be understood that high-k dielectric layer 101 may be formed in a recess in substrate 100, as shown in FIG. 5A. Further, the recess may have a semiconductor fin.

Figure 5B:
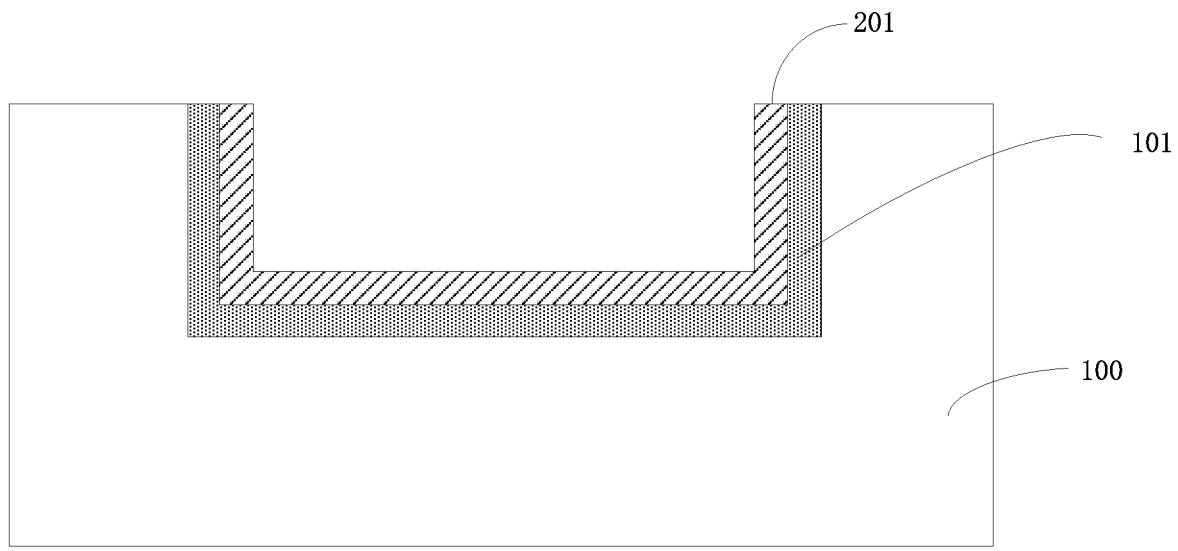
FIG. 5B is a cross-sectional view illustrating an intermediate stage of a method for manufacturing a gate stack structure for a MOS varactor according to one embodiment of the present disclosure.

Referring to FIG. 5B, a first TiN layer 201 is formed on high-k dielectric layer 101.

Figure 5C:
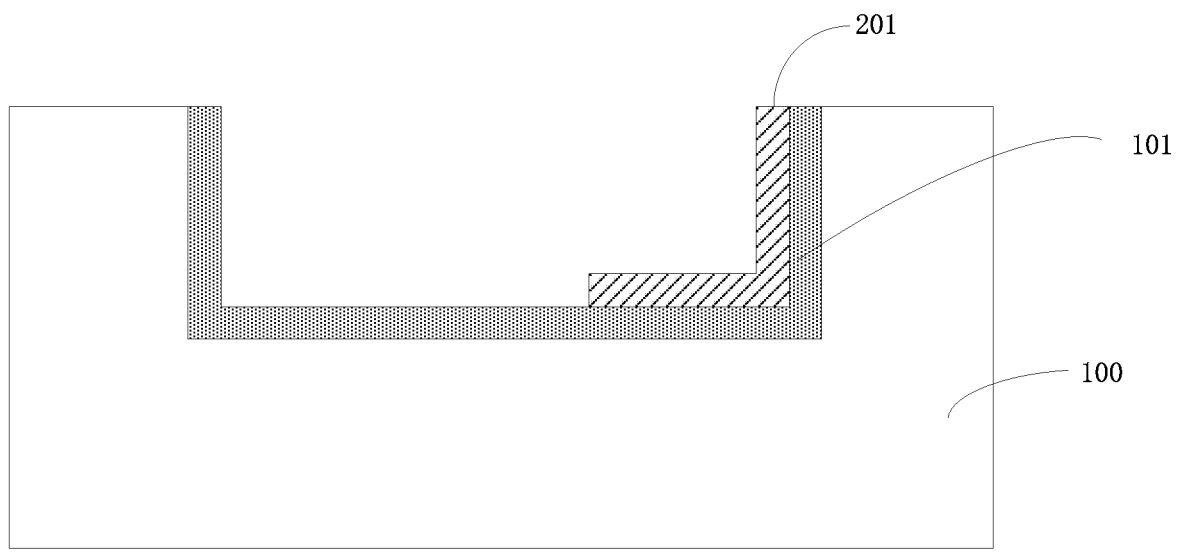
FIG. 5C is a cross-sectional view illustrating an intermediate stage of a method for manufacturing a gate stack structure for a MOS varactor according to one embodiment of the present disclosure.

Referring to FIG. 5C, a portion of first TiN layer 201 on high-k dielectric layer 101 is removed to expose a portion of high-k dielectric layer 101.

Figure 5D:
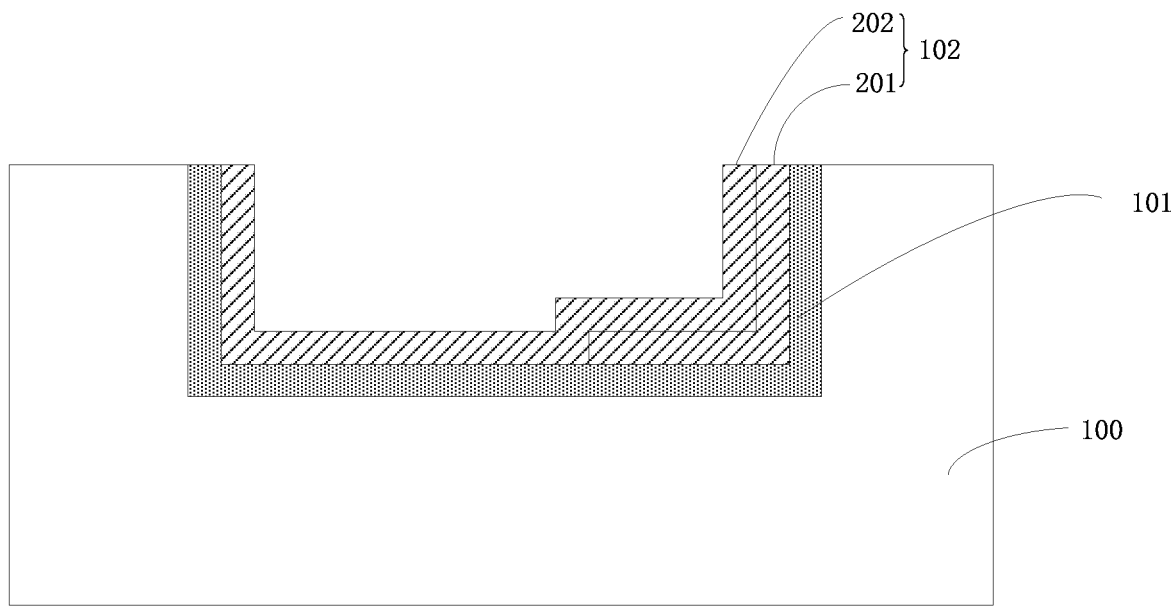
FIG. 5D is a cross-sectional view illustrating an intermediate stage of a method for manufacturing a gate stack structure for a MOS varactor according to one embodiment of the present disclosure.

Referring to FIG. 5D, a second TiN layer 202 is formed on the remaining first TiN layer 201 and on the exposed portion of high-k dielectric layer 101. The remaining first TiN layer 201 and second TiN layer 202 serve as a P-type work function adjustment layer 102.

Figure 5E:
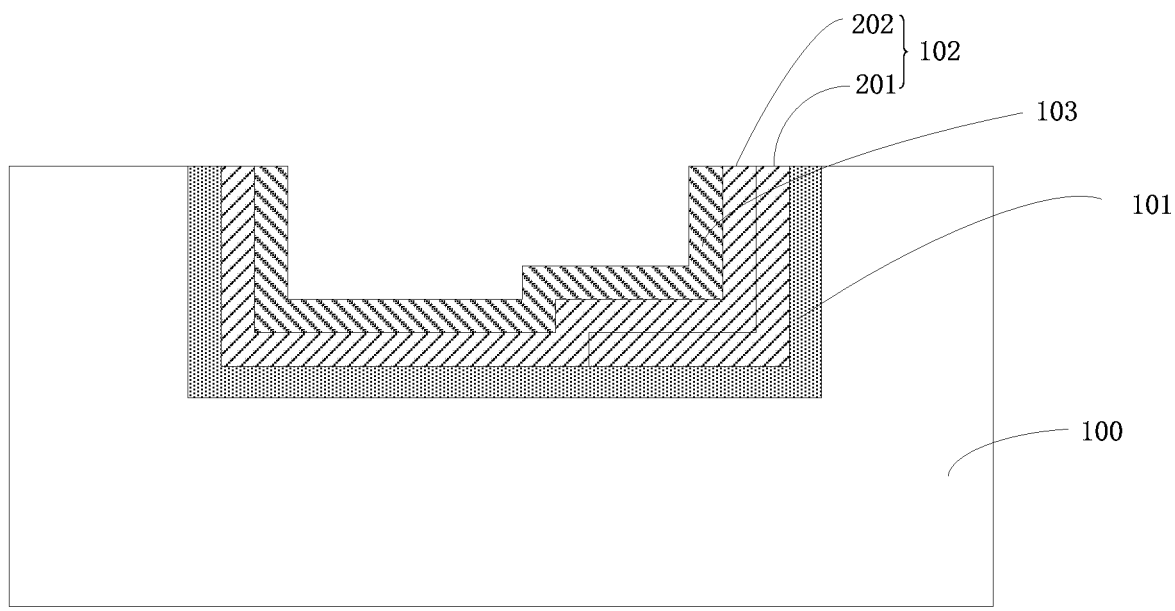
FIG. 5E is a cross-sectional view illustrating an intermediate stage of a method for manufacturing a gate stack structure for a MOS varactor according to one embodiment of the present disclosure.

Referring to FIG. 5E, an N-type work function adjustment layer 103 is formed on second TiN layer 102. N-type work function adjustment layer 103 may include TiAl, TiCAl, TiNAl, or TiSiAl.

Figure 5F:
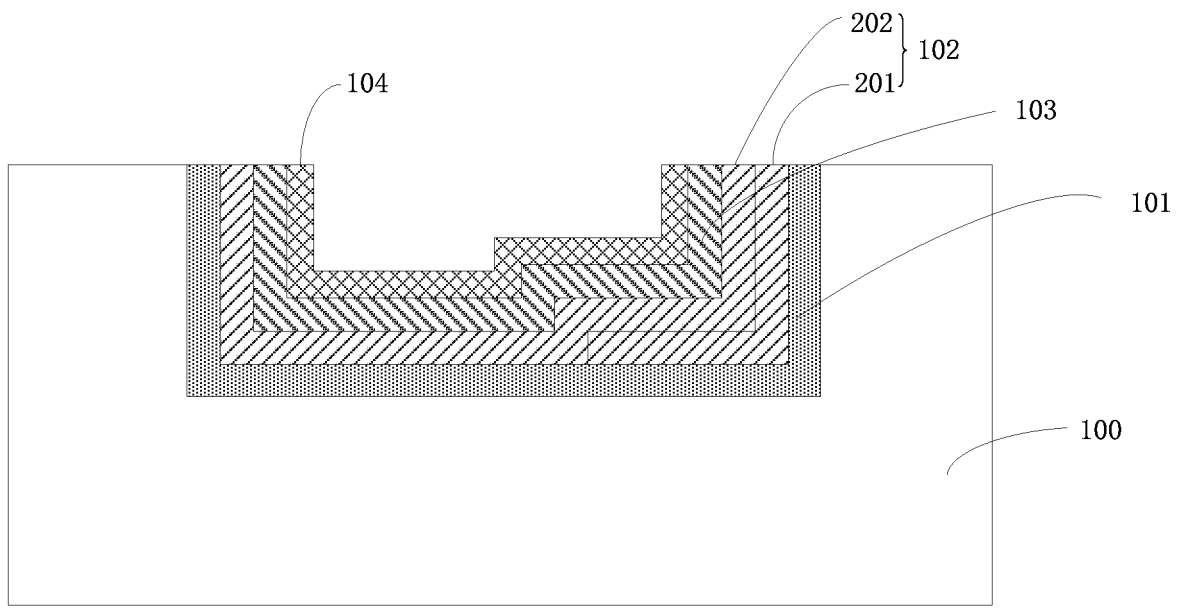
FIG. 5F is a cross-sectional view illustrating an intermediate stage of a method for manufacturing a gate stack structure for a MOS varactor according to one embodiment of the present disclosure.

Referring to FIG. 5F, a barrier layer 104 is formed on N-type work function adjustment layer 103. Barrier layer 104 may include, for example, TiN, Ti, or a layer stack including at least one TiN layer and one Ti (titanium) layer. Barrier layer 104 may diffuse metal elements of a subsequent formed metal gate 105 into N-type work function adjustment layer 103, and also bond subsequent metal gate 105 to N-type work function adjustment layer 103 more closely.

Figure 5G:
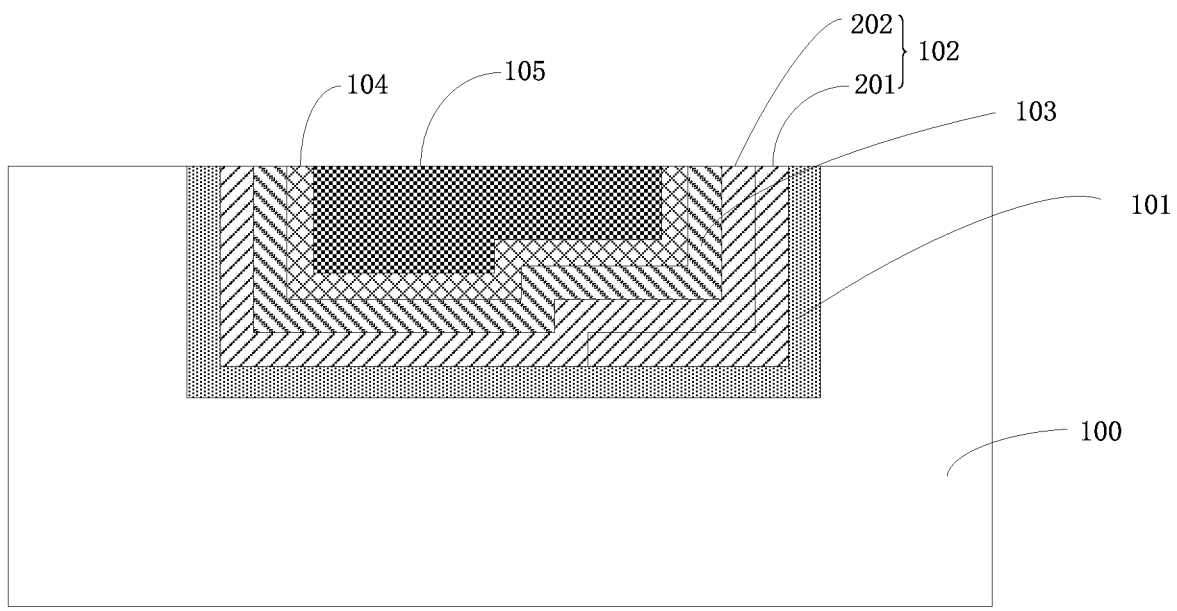
FIG. 5G is a cross-sectional view illustrating an intermediate stage of a method for manufacturing a gate stack structure for a MOS varactor according to one embodiment of the present disclosure.

Referring to FIG. 5G, a metal gate 105 (e.g., tungsten) is formed on barrier layer 104.

FIGS. 6A through 6H are cross-sectional views illustrating intermediate stages of a method for manufacturing a gate stack structure for a MOS varactor according to another embodiment of the present disclosure.

Figure 6A:
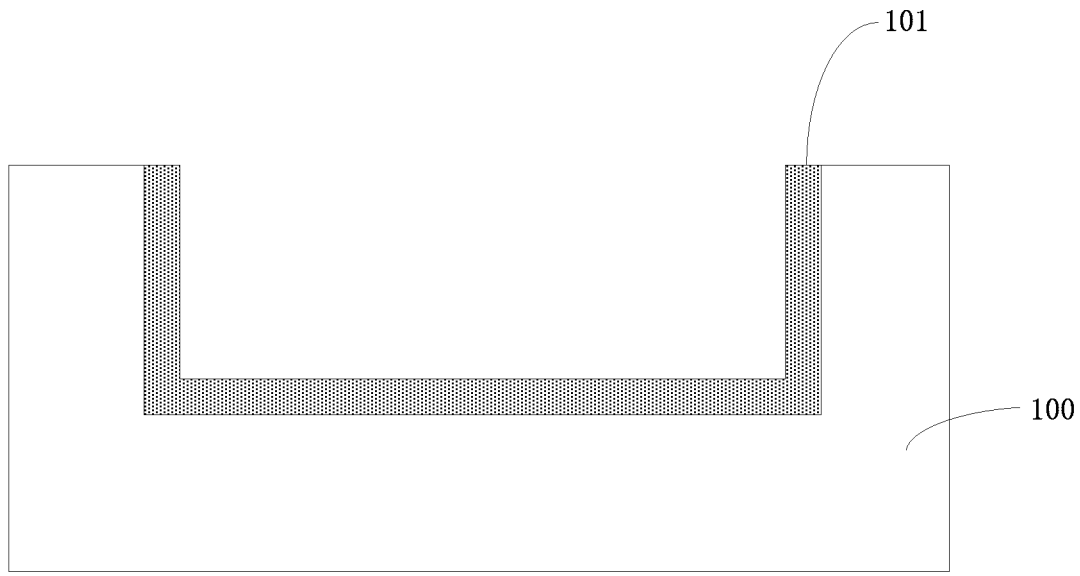
FIG. 6A is a cross-sectional view illustrating an intermediate stage of a method for manufacturing a gate stack structure for a MOS varactor according to another embodiment of the present disclosure.

Referring to FIG. 6A, a substrate 100 is provided. Substrate 100 includes a channel region (not shown). Substrate 100 may further include a shallow trench isolation structure or the like. Thereafter, a high-k dielectric layer 101 is formed (e.g., using a deposition process) on the channel region in substrate 100. It is to be understood that high-k dielectric layer 101 may be formed in a recess in substrate 100, as shown in FIG. 6A.

Figure 6B:
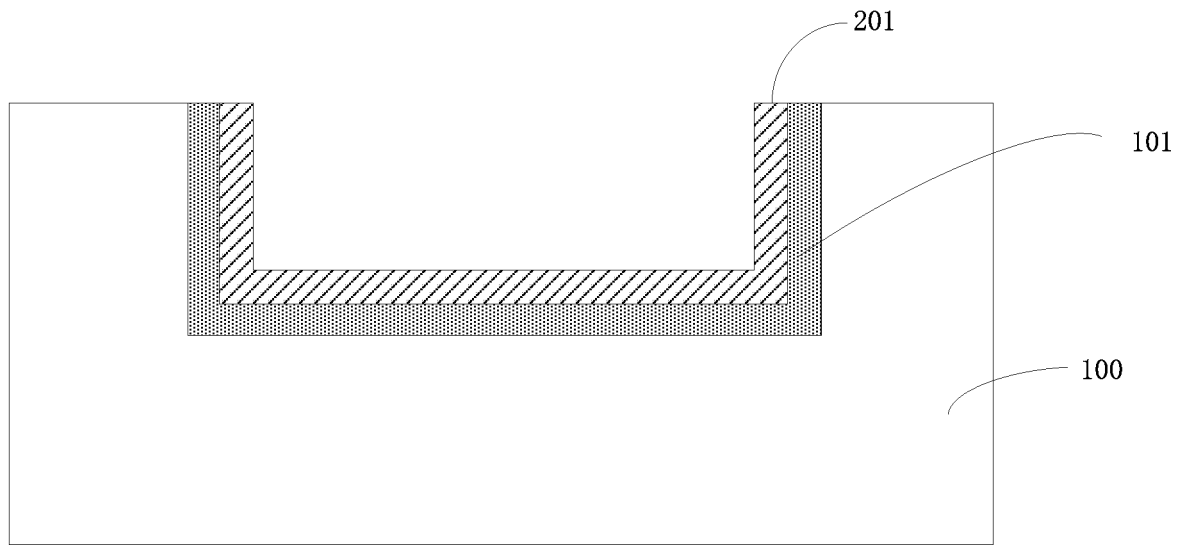
FIG. 6B is a cross-sectional view illustrating an intermediate stage of a method for manufacturing a gate stack structure for a MOS varactor according to another embodiment of the present disclosure.

Referring to FIG. 6B, a first TiN layer 201 is formed on high-k dielectric layer 101.

Figure 6C:
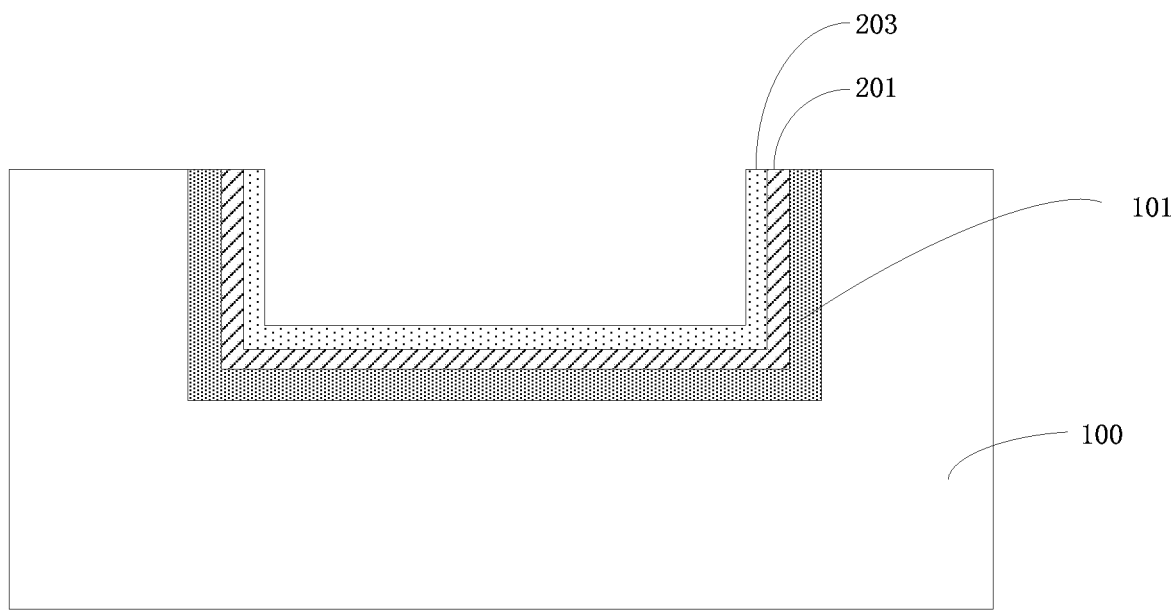
FIG. 6C is a cross-sectional view illustrating an intermediate stage of a method for manufacturing a gate stack structure for a MOS varactor according to another embodiment of the present disclosure.

Referring to FIG. 6C, a TaN layer 203 is formed on first TiN layer 201.

Figure 6D:
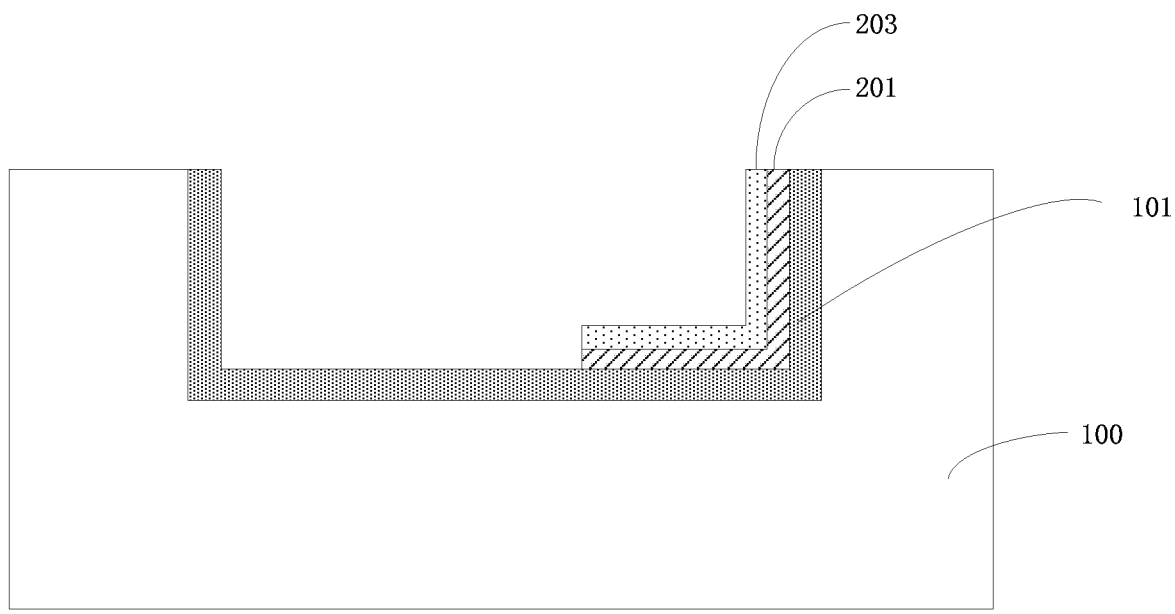
FIG. 6D is a cross-sectional view illustrating an intermediate stage of a method for manufacturing a gate stack structure for a MOS varactor according to another embodiment of the present disclosure.

Referring to FIG. 6D, a portion of TaN layer on first TiN and a portion of first TiN layer 201 on high-k dielectric layer 101 are removed exposed a portion of high-k dielectric layer 101.

Figure 6E:
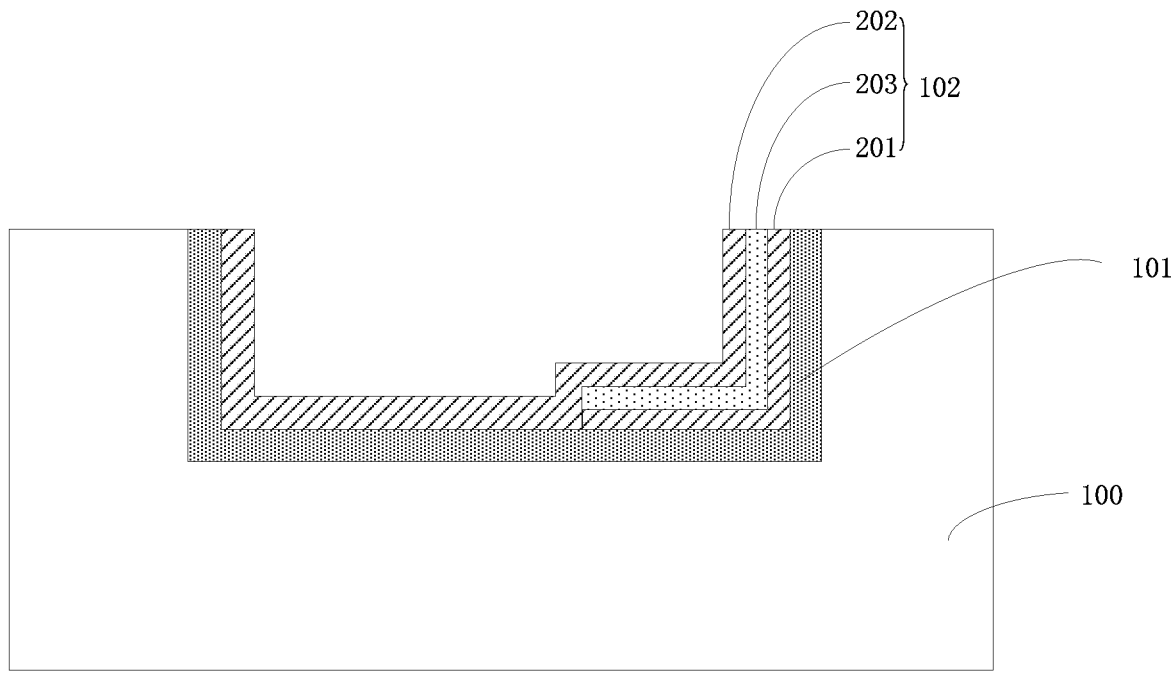
FIG. 6E is a cross-sectional view illustrating an intermediate stage of a method for manufacturing a gate stack structure for a MOS varactor according to another embodiment of the present disclosure.

Referring to FIG. 6E, a second TiN layer 202 is formed on the remaining portion of TaN layer 203 and on the exposed portion of high-k dielectric layer 101. The remaining portion of TaN layer 203, the remaining portion of TiN layer 201, and second TiN layer 202 serve as a P-type work function adjustment layer.

Figure 6F:
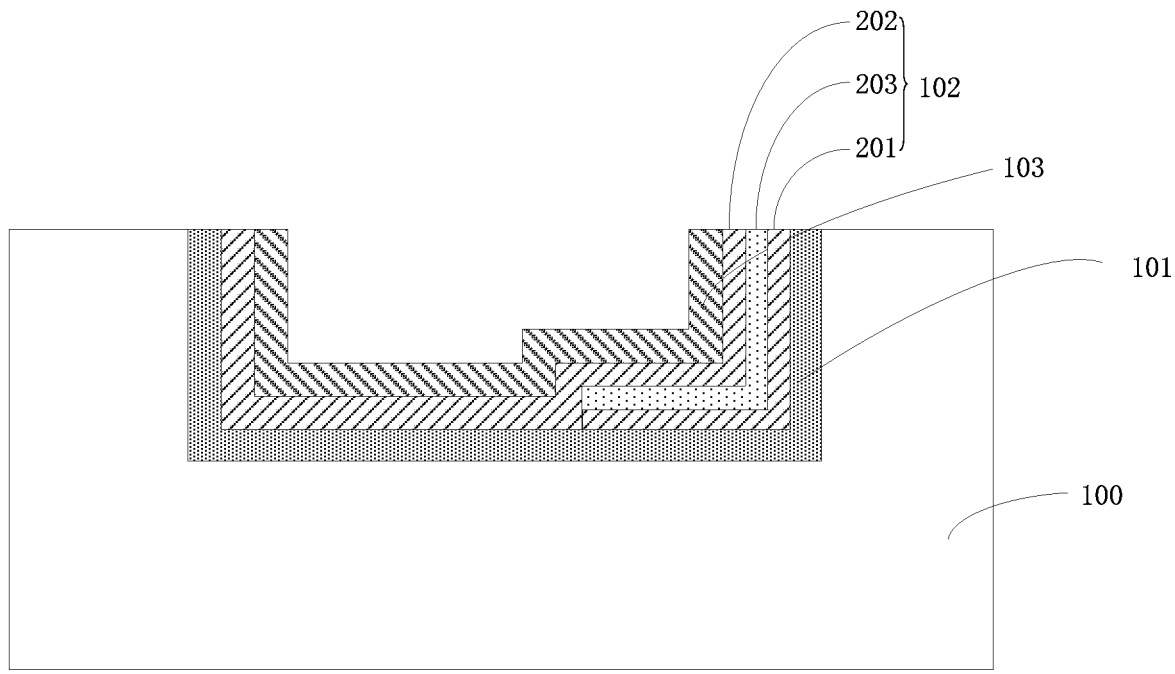
FIG. 6F is a cross-sectional view illustrating an intermediate stage of a method for manufacturing a gate stack structure for a MOS varactor according to another embodiment of the present disclosure.

Referring to FIG. 6F, an N-type work function adjustment layer 103 is formed on second TiN layer 202. N-type work function adjustment layer 103 may include TiAl, TiCAl, TiNAl, or TiSiAl.

Figure 6G:
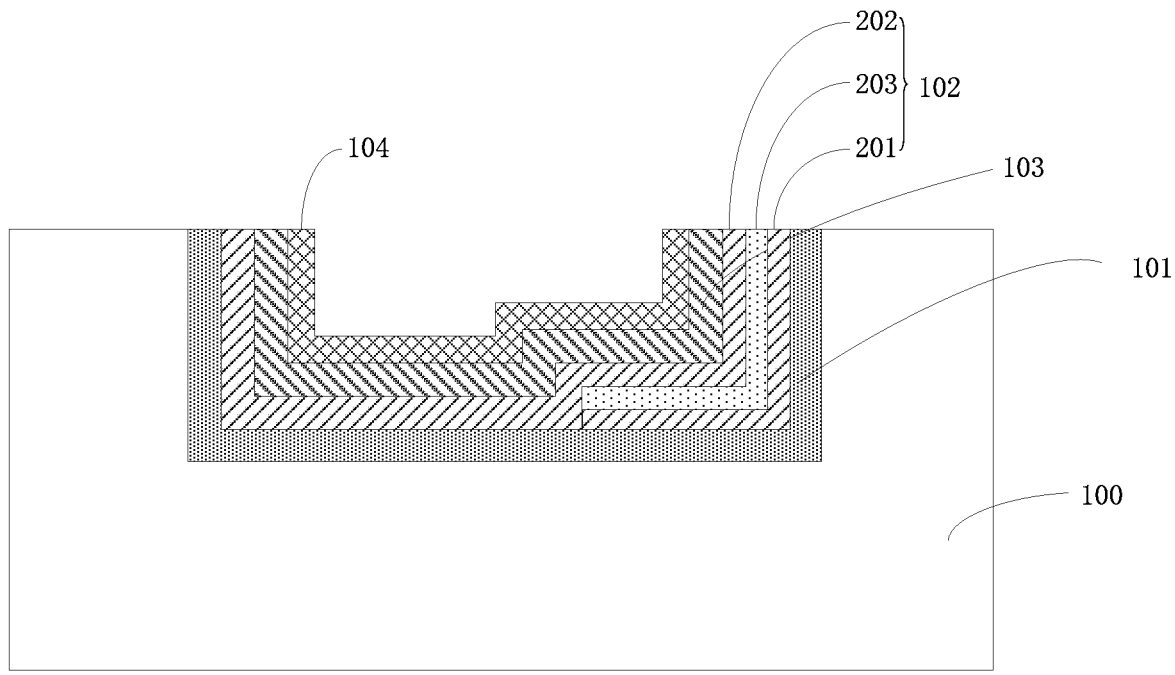
FIG. 6G is a cross-sectional view illustrating an intermediate stage of a method for manufacturing a gate stack structure for a MOS varactor according to another embodiment of the present disclosure.

Referring to FIG. 6G, a barrier layer 104 is formed on N-type work function adjustment layer 103. Barrier layer 104 may include, for example, TiN, Ti, or a layer stack including at least one TiN layer and one Ti layer.

Figure 6H:
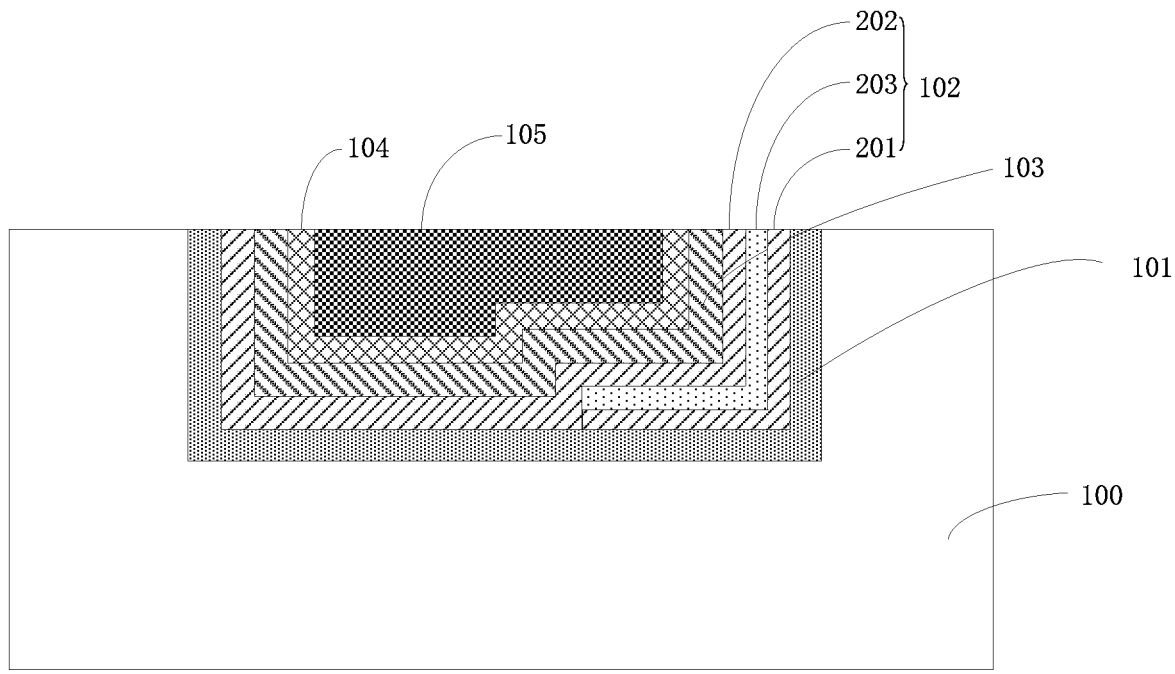
FIG. 6H is a cross-sectional view illustrating an intermediate stage of a method for manufacturing a gate stack structure for a MOS varactor according to another embodiment of the present disclosure.

Referring to FIG. 6H, a metal gate 105 is formed on barrier layer 104.

FIGS. 7A through 7H are cross-sectional views illustrating intermediate stages of a method for manufacturing a gate stack structure for a MOS varactor according to yet another embodiment of the present disclosure.

Figure 7A:
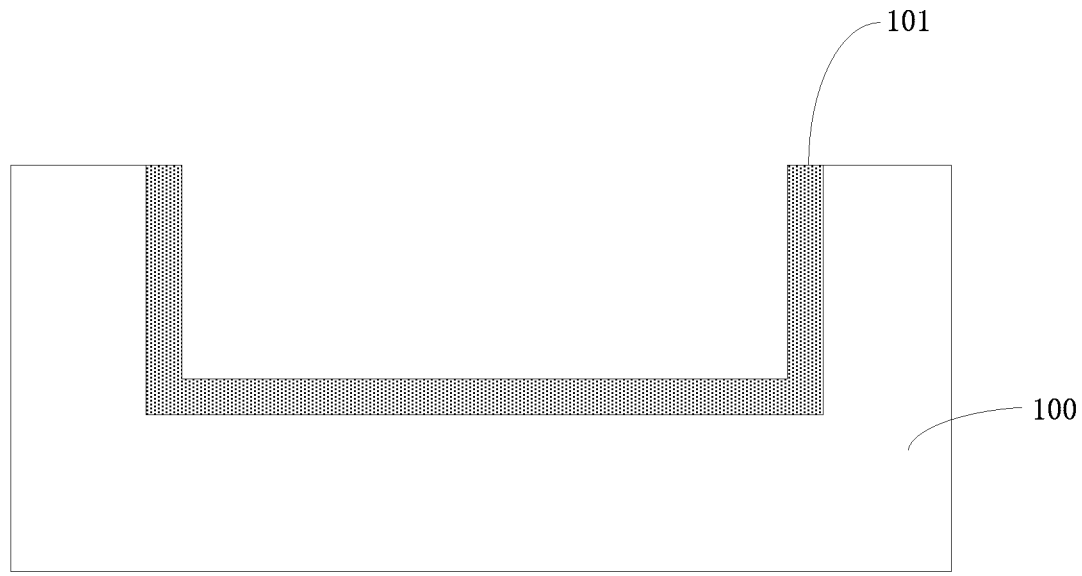
FIG. 7A is a cross-sectional view illustrating an intermediate stage of a method for manufacturing a gate stack structure for a MOS varactor according to yet another embodiment of the present disclosure.

Referring to FIG. 7A, a substrate 100 is provided. Substrate 100 includes a channel region (not shown). Substrate 100 may further include a shallow trench isolation structure or the like. Thereafter, a high-k dielectric layer 101 is formed (e.g., using a deposition process) on the channel region in substrate 100. It is to be understood that high-k dielectric layer 101 may be formed in a recess in substrate 100, as shown in FIG. 7A.

Figure 7B:
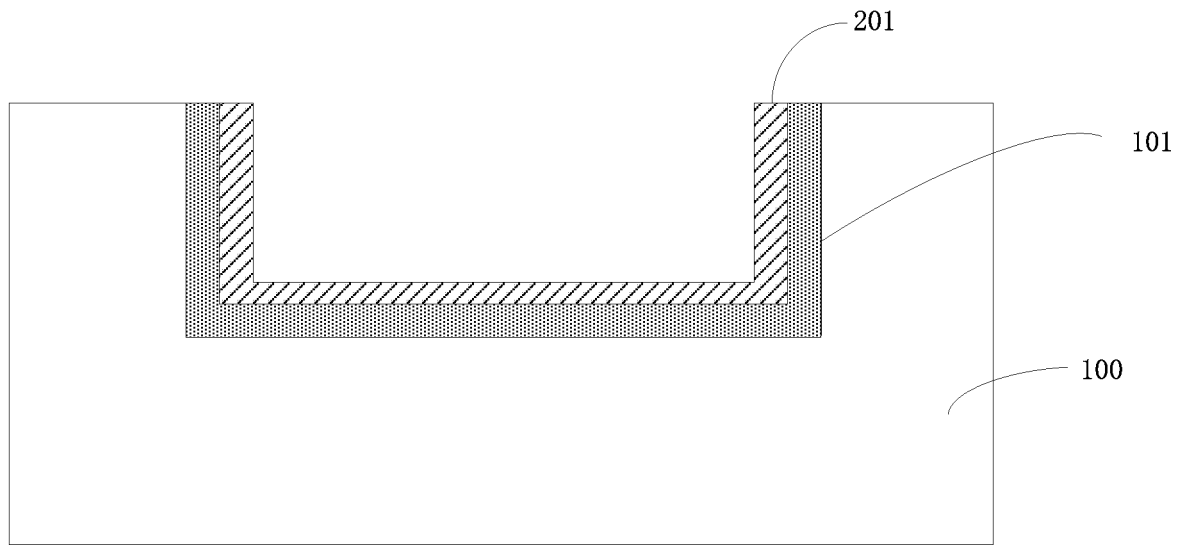
FIG. 7B is a cross-sectional view illustrating an intermediate stage of a method for manufacturing a gate stack structure for a MOS varactor according to yet another embodiment of the present disclosure.

Referring to FIG. 7B, a first TiN layer 201 is formed on high-k dielectric layer 101.

Figure 7C:
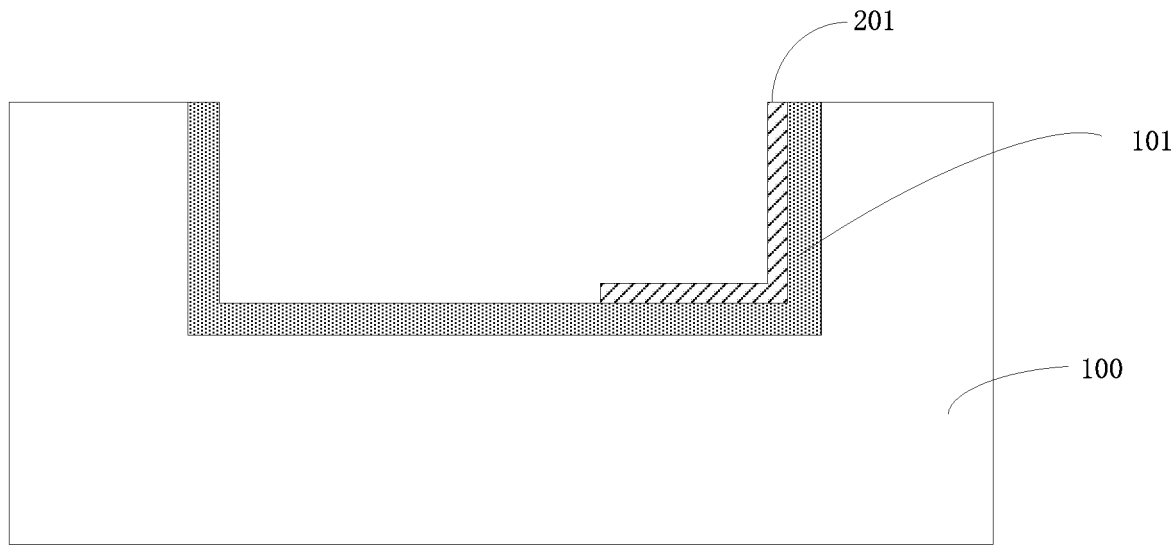
FIG. 7C is a cross-sectional view illustrating an intermediate stage of a method for manufacturing a gate stack structure for a MOS varactor according to yet another embodiment of the present disclosure.

Referring to FIG. 7C, a portion of first TiN layer 201 on high-k dielectric layer 101 is removed to expose a portion of high-k dielectric layer 101.

Figure 7D:
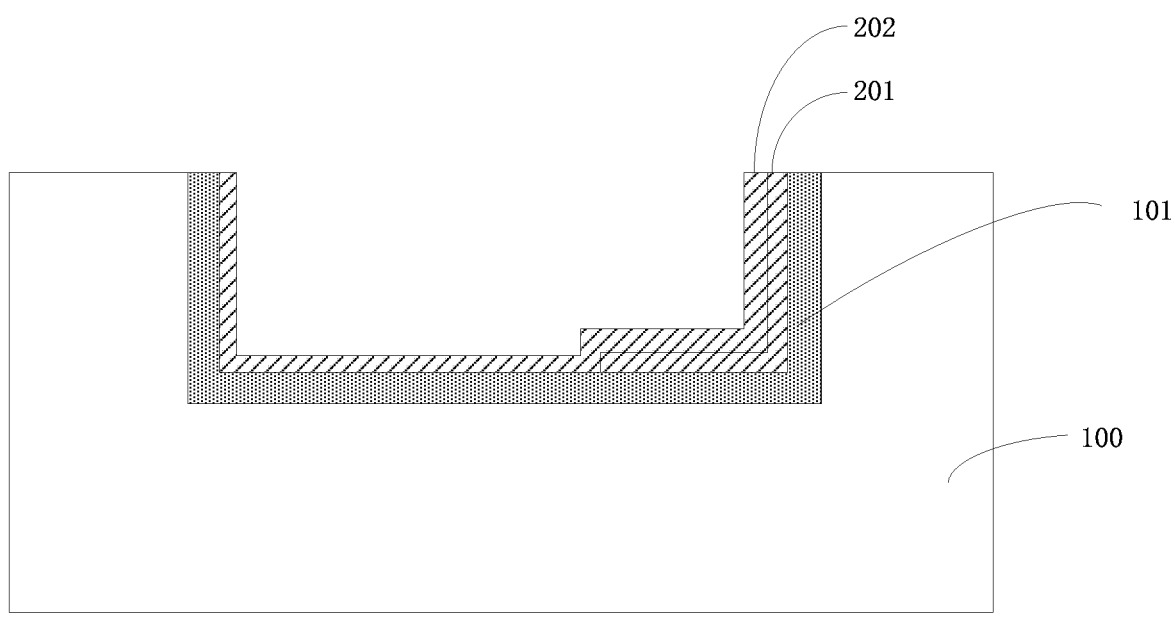
FIG. 7D is a cross-sectional view illustrating an intermediate stage of a method for manufacturing a gate stack structure for a MOS varactor according to yet another embodiment of the present disclosure.

Referring to FIG. 7D, a second TiN layer 202 is formed on the remaining portion of first TiN layer 201 and the exposed portion of high-k dielectric layer 101.

Figure 7E:
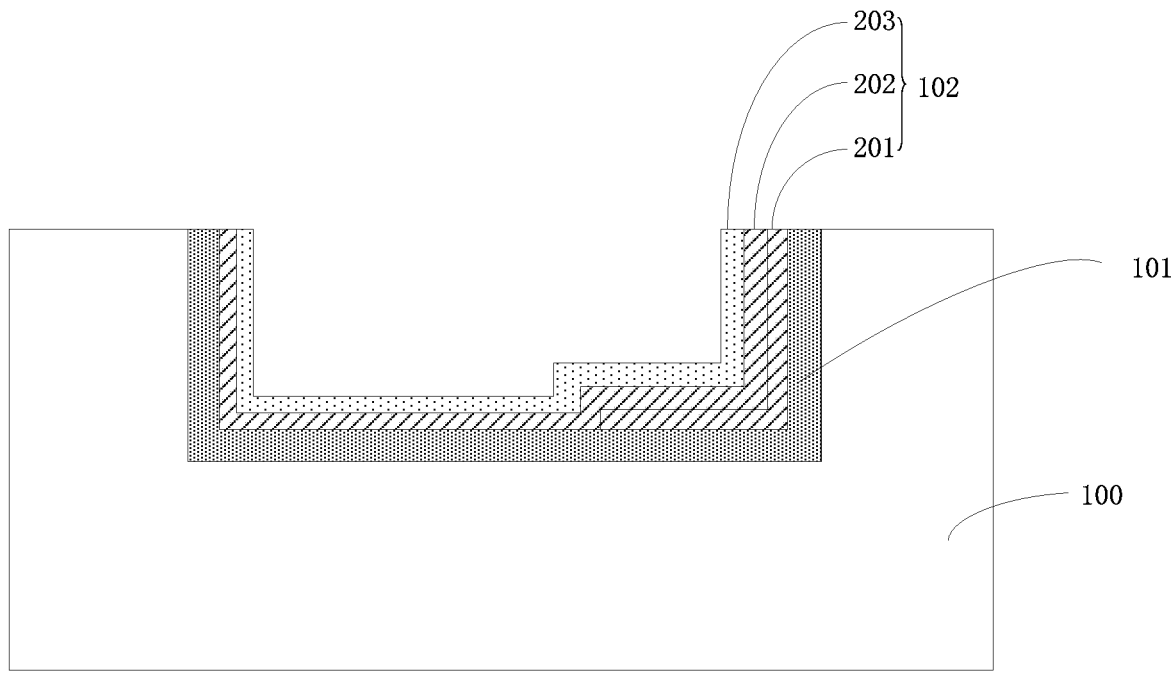
FIG. 7E is a cross-sectional view illustrating an intermediate stage of a method for manufacturing a gate stack structure for a MOS varactor according to yet another embodiment of the present disclosure.

Referring to FIG. 7E, a TaN layer 203 is formed on second TiN layer 202. The remaining portion of first TiN layer 201, second TiN layer 202 and TaN layer 203 serve as a P-type work function adjustment layer 102.

Figure 7F:
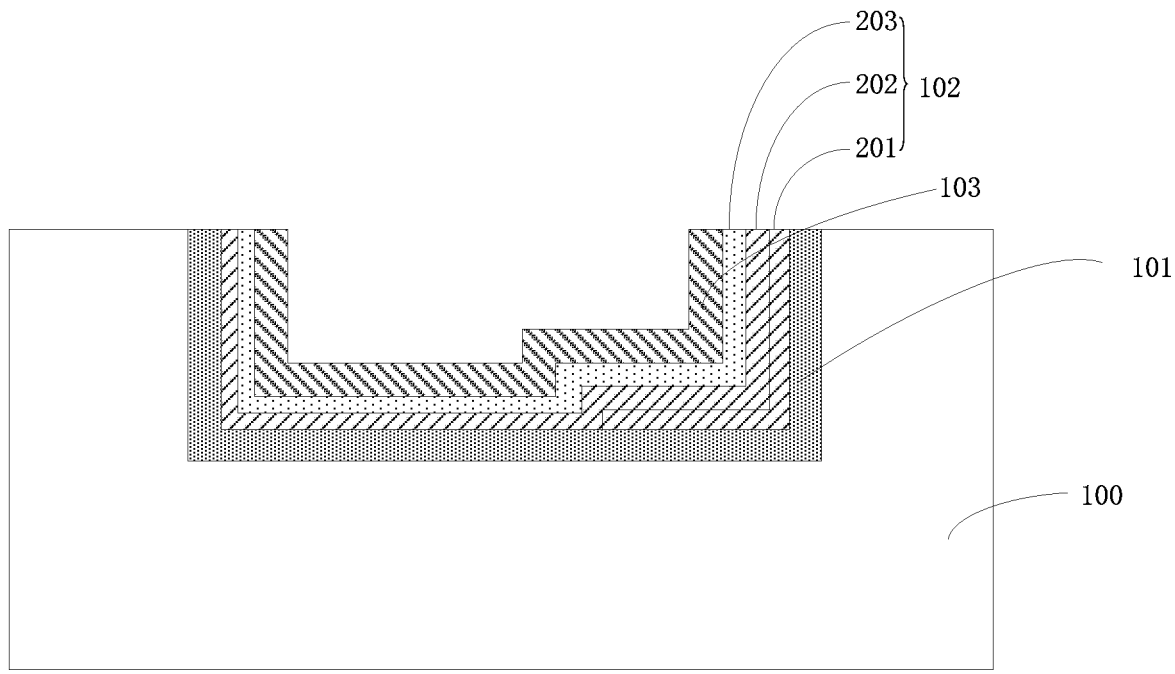
FIG. 7F is a cross-sectional view illustrating an intermediate stage of a method for manufacturing a gate stack structure for a MOS varactor according to yet another embodiment of the present disclosure.

Referring to FIG. 7F, an N-type work function adjustment layer 103 is formed on TaN layer 203. N-type work function adjustment layer 103 may include TiAl, TiCAl, TiNAl, or TiSiAl. TaN layer 203 may prevent metal elements (e.g., Al) in N-type work function adjustment layer 103 from diffusing into high-k dielectric layer 101.

Figure 7G:
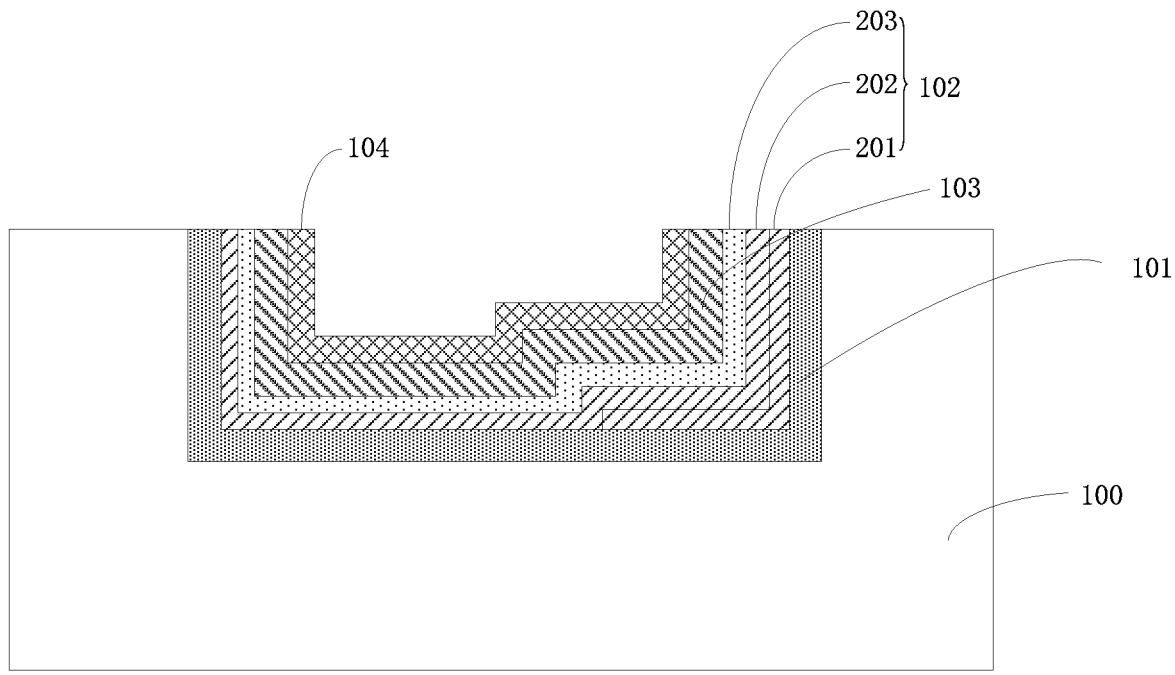
FIG. 7G is a cross-sectional view illustrating an intermediate stage of a method for manufacturing a gate stack structure for a MOS varactor according to yet another embodiment of the present disclosure.
Figure 7H:
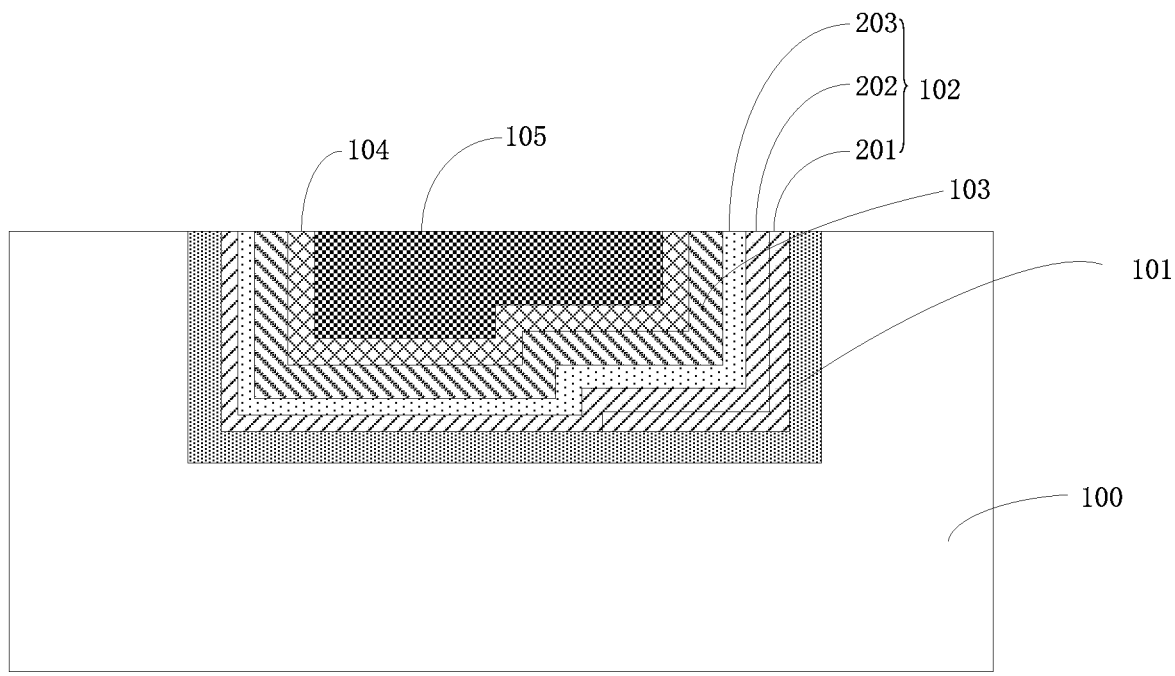
FIG. 7H is a cross-sectional view illustrating an intermediate stage of a method for manufacturing a gate stack structure for a MOS varactor according to yet another embodiment of the present disclosure.

Referring to FIG. 7G, a barrier layer 104 is formed on N-type work function adjustment layer 103.

It is to be understood that the three embodiments described above have different focuses and/or applications. The similar or same process steps of the three embodiments may be cross-referenced.

It is to be understood that the above-described layers may also be formed on the surface of the substrate during deposition. FIGS. 5A through 5G, 6A through 6H, and 7A-7H only illustrate exemplary depositions of the material layers on the bottom and on sidewalls of the recess. In one embodiment, a chemical mechanical polishing process may be performed after the deposition of a material layer. In another embodiment, after all the materials layers have been deposited, i.e., after the deposition of the metal gate layer, a chemical mechanical polishing process may be performed such that the upper surface of the metal gate is substantially flush with the upper surface of the substrate.

The above-described gate structures for MOS varactors can be used for planar devices as well as for FinFET devices. The above-described methods of manufacturing the gate stack structure for MOS varactors are also suitable for planar devices and FinFET devices. That is, the MOS varactor provided by the present disclosure may be a planar device of a FinFET device.

Thus, a gate stack structure for a MOS varactor, a manufacturing method thereof and a MOS varactor device according to the present disclosure have described in detail above. In order not to obscure the concepts presented herein, some of the details known in the art are omitted. One of skill in the art will be able to modify and/or adapt for various applications such specific embodiments without undue experimentation.

References in the specification to "one embodiment", "an embodiment", "an example embodiment", "some embodiments", etc., indicate that the embodiment described may include a particular feature, structure, or characteristic; but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a gate stack structure for a MOS varactor, the method comprising:
   providing a substrate including a channel region;
   forming a high-k dielectric layer on the channel region;
   forming a P-type work function layer on the high-k dielectric layer, the P-type work function adjustment layer including a first portion and a second portion laterally adjacent to each other, the first portion having a thickness greater than a thickness of the second portion;
   forming an N-type work function adjustment layer on the P-type work function adjustment layer; and
   forming a metal gate on the N-type work function adjustment layer.

2. The method of claim 1, wherein forming the P-type work function layer comprises:
   forming a first TiN layer on the high-k dielectric layer;
   removing a portion of the first TiN layer to expose a portion of the high-k dielectric layer;
   forming a second TiN layer on a remaining portion of the first TiN layer and on the exposed portion of the high-k dielectric layer.

3. The method of claim 1, wherein forming the P-type work function layer comprises:
   forming a first TiN layer on the high-k dielectric layer;
   forming a TaN layer on the first TiN layer;

removing a portion of the TaN layer and a portion of the first TiN layer to expose a portion of the high-k dielectric layer;

forming a second TiN layer on a remaining portion of the TaN layer and on the exposed portion of the high-k dielectric layer.

4. The method of claim 1, wherein forming the P-type work function layer comprises:

forming a first TiN layer on the high-k dielectric layer;

removing a portion of the first TiN layer to expose a portion of the high-k dielectric layer;

forming a second TiN layer on a remaining portion of the first TiN layer and on the exposed portion of the high-k dielectric layer; and forming a TaN layer on the second TiN layer.

5. The method of claim 1, further comprising:

forming a barrier layer on the N-type work function adjustment layer.

6. The method of claim 1, wherein the N-type work function adjustment layer comprises TiAl, TiCAl, TiNAl, or TiSiAl.

7. The method of claim 1, wherein a ratio of a length of the first portion to a length of the second portion of the P-type work function adjustment layer is in a range between 1/9 and 9.

* * * * *